(12) United States Patent
Wang et al.

(10) Patent No.: US 6,326,317 B1
(45) Date of Patent: Dec. 4, 2001

(54) METHOD FOR FABRICATING METAL OXIDE SEMICONDUCTOR FIELD EFFECT TRANSISTOR (MOSFET)

(75) Inventors: Hwei-Heng Wang, Taoyuan; Yeong-Her Wang; Mau-Phon Houng, both of Tainan, all of (TW)

(73) Assignee: National Science Council (TW)

( * ) Notice: Subject to any disclaimer, the term of this patent is extended or adjusted under 35 U.S.C. 154(b) by 0 days.

(21) Appl. No.: 09/399,680

(22) Filed: Sep. 21, 1999

(30) Foreign Application Priority Data

Jan. 29, 1999 (TW) ................................................ 88101420

(51) Int. Cl.$^7$ .......................... H01L 21/31; H01L 21/469
(52) U.S. Cl. .......................... 438/779; 438/300; 438/589; 438/606; 438/635
(58) Field of Search ..................................... 438/299, 300, 438/589, 590, 604–607, 635, 767, 779, 285, 931

(56) References Cited

U.S. PATENT DOCUMENTS

| | | | |
|---|---|---|---|
| 4,784,967 | * 11/1988 | Cunningham et al. | 438/172 |
| 5,356,823 | * 10/1994 | Mitani | 438/180 |
| 5,399,515 | * 3/1995 | Davis et al. | 438/270 |
| 5,723,376 | * 3/1998 | Takeuchi et al. | 438/270 |

OTHER PUBLICATIONS

J.Y. Wu, H.H. Wang, Y.H. Wang, M.P. Houng, "A GaAs MOSFET with a Liquid Phase Oxidized Gate", *IEEE Electron Device Letters*, vol. 20, No. 1, Jan. 1999, pp. 18–20.

H.H. Wang, C.J. Huang, Y.H. Wang, M.P. Houng, "Liquid Phase Chemical–Enhanced Oxidation for GaAs Operated Near Room Temperature", *Jpn. J. Appl. Phys.*, vol. 37, 1998, pp. L67–L70.

* cited by examiner

*Primary Examiner*—Carl Whitehead, Jr.
*Assistant Examiner*—Janie L. Brophy
(74) *Attorney, Agent, or Firm*—Greer, Burns & Crain, Ltd.

(57) ABSTRACT

Disclosed is a method for manufacturing a metal oxide semiconductor FET (MOSFET), which utilizes a low-temperature liquid phase oxidation for III–V group. The method includes the steps of (a) providing a substrate, (b) forming an epitaxial layer on the substrate, (c) defining and forming a drain and a source on a portion of the epitaxial layer, (d) forming a recess in an another portion of the epitaxial layer, (e) forming an oxide layer on a surface of the recess by relatively low-temperature oxidation, and (f) forming a gate on a portion of the oxide layer between the drain and source. In addition, the method further includes two selective procedures, that is, a synchronic sulfurated passivation process which can be performed with the growth of the oxide film simultaneously, and a rapid thermal annealing (RTA) process.

31 Claims, 10 Drawing Sheets

METHOD FOR FABRICATING METAL OXIDE SEMICONDUCTOR FIELD EFFECT TRANSISTOR (MOSFET)

FIELD OF THE INVENTION

The present invention is related to a method for fabricating a metal oxide semiconductor field effect transistor (MOSFET) and more particularly to a method for fabricating a metal oxide semiconductor field effect transistor (MOSFET) on a gallium arsenide (GaAs) substrate.

BACKGROUND OF THE INVENTION

For several ten years, the field effect transistor (FET) has been significantly developed in the application of semiconductor device. Due to its low-power dissipation and highly integrated technique, it plays the most important role in the field of very-large-scale integration (VLSI), particularly in ultra-large-scale integration (ULSI). There are many kinds of FET design, in which the main differences are in the gate and channel structures. In the fabrication of an integrated circuit using silicon as a material, a metal oxide semiconductor FET (MOSFET) has the properties of high yield rate and excellent reliability in addition to the above-described advantages of FET. Therefore, MOSFET has become the commonly used device in recent years. Certainly, there are some other designs for FET, such as a metal-insulator-semiconductor (MOSFET), an insulator-gate FET (IGFET), a junction-gate FET (JFET) using reversely biased p-n junction as a gate, a metal-semiconductor FET (MOSFET) using the metal-semiconductor schottky contact as a gate, and a modulation-doped FET (MOSFET).

In the fabrication of an integrated circuit using a GaAs material, although the electron mobility of GaAs is several times higher than that of silicon, the former is not so popular as the latter when used in the semiconductor industry. Except for its relatively expensive cost, the reason is that GaAs is unstable at a temperature greater than 650° C. so that a high-quality oxide layer can not be fabricated in the high-temperature tube. The oxide layer with bad reliability and low interface density will bring about a difficulty in the fabrication of enhancement-mode MOS and limit the design and operation of many other FET structures. Therefore, it is desirable to overcome the problem encountered by the application of GaAs material.

In our previous studies (please see Hwei-Heng Wang et al., Japanese J. of Applied Physics, Pt. 2 (Letters) Vol. 37, No. 1 AB, pp. L-67-L70, 1998), we proposed a method for selectively forming an oxide layer on a portion uncovered by the photoresist or noble netal layer near the room temperature (40~70° C.). Thus, how to combine the above-described processes for manufacturing the field effect transistors with this method and use GaAs as a substrate of metal oxide semiconductor FET (MOSFET) is the developing purpose of the invention.

SUMMARY OF THE INVENTION

An object of the present invention is to provide a method for fabricating a metal oxide semiconductor field effect transistor (MOSFET) on a gallium arsenide (GaAs) substrate.

In the first preferred embodiment of the present invention, the method includes the steps of (a) providing a substrate; (b) forming an epitaxial layer on the substrate; (c) defining and forming a drain and a source on a portion of the epitaxial layer; (d) forming a recess in another portion of the epitaxial layer; (e) forming an oxide layer on a surface of the recess by relatively low-temperature oxidation; and (f) forming a gate on a portion of the oxide layer between the drain and source.

Preferably, the substrate is a semi-insulating GaAs substrate.

The epitaxial layer includes a buffer layer, a moderately doped layer, and a heavily doped layer. The buffer layer is an undoped layer and has a thickness of about 5000 Å. The moderately doped layer has a thickness ranging from 2000 Å to 3000 Å, a concentration of $10^{16}$~$10^{17}$ $cm^{-3}$, and serves as a channel. The heavily doped layer has a thickness of 1000 Å, a concentration greater than $10^{18}$ $cm^{-3}$, and serves as an ohmic contact for the source and drain.

After the step (b), the method further includes a step (b1) of immersing the wafer in 2-propanol, acetone, and methanol in sequence and cleaning the wafer by an ultrasonic oscillator. Thereafter, a lithographic process is performed to etch the epitaxial layer for giving a mesa isolation, in which the mesa deepens to a place lower than the buffer layer to isolate all formed devices on the wafer, and a height of the mesa ranges from 6000 Å to 8000 Å. The mesa isolation is achieved by using an etching solution containing HF, $H_2O_2$, and $H_2O$ (HF: $H_2O_2$: $H_2O$=1:2:25 by volume) for giving rounded edges to the mesa.

Certainly, the step (c) further includes steps of: (c1) coating a photoresist on the epitaxial layer; (c2) performing a lithographic process to pattern the photoresist for defining and forming the drain and source on the portion of the epitaxial layer; (c3) coating an alloy film on the drain and source; (c4) using a lift-off procedure to leave a drain/source metal in place; and (c5) executing an annealing process to accomplish a metallization process of the drain and source. In the step (c3), the alloy film is deposited by e-beam evaporation using Au/Ge/Ni or Au/Be. In the step (c5), the annealing process is performed at 450~600° C. for 10~25 seconds.

In the step (d), the epitaxial layer is partially etched by using an etching solution containing $NH_3$, $H_2O_2$, and $H_2O$ ($NH_3$: $H_2O_2$: $H_2O$=3:1:50 by volume) and using the drain/source metal as a mask to form the recess in the another portion of the epitaxial layer.

In the step (e), a formed thickness of the oxide layer is controlled by using 1.15M nitric acid solution containing 0.36 mole of Ga ion whose initial pH value is adjusted to 4.3 by 2.5% ammonium hydroxide hydroxide ($NH_4OH$) solution. During the formation of the oxide layer, an ammonium hydroxide solution, prepared from diluting 28% ammonium hydroxide solution with de-ionized water to 300 folds, is added therein for adjusting the pH value within a range between 4.0 and 5.0 to control the growth rate and refractive index of the formed oxide layer.

The gate is formed by steps of coating a photoresist on the fabricated wafer, performing a lithographic process to pattern the photoresist for defining a gate region on the portion of the oxide layer, coating a conducting layer with a relatively high conductivity on the defined region for the gate, and using a lift-off procedure to form the gate on the portion of the oxide layer. Preferably, the conducting layer can be made of gold, aluminum, or polysilicon.

In the second preferred embodiment of the present invention, the step (e) further includes a step (e1) of performing a synchronic sulfurated passivation process by adding a processed $(NH_4)_2S$ solution, prepared from adding sulfur powder to $(NH_4)_2S$ solution, stirring, and filtering out the undissolved sulfur powder, to a system solution for forming the oxide layer at any time during the formation of the oxide layer.

In the third preferred embodiment of the present invention, after the step (e1), the method further includes a step (e2) of performing a rapid thermal annealing (RTA) process, wherein the wafer is heat-treated and irradiated for several to several ten seconds. Certainly, after performing the rapid thermal annealing process, the method further includes a step of immersing the wafer in 2-propanol, acetone, and methanol in sequence and cleaning the fabricated wafer by an ultrasonic oscillator to remove an impurity deposited on the fabricated wafer during the rapid thermal annealing process.

In the fourth preferred embodiment of the present invention, the method for fabricating a metal oxide semiconductor field effect transistor (MOSFET) includes the steps of: (a) providing a substrate; (b) forming an epitaxial layer on the substrate; (c) forming a recess in a first portion of the epitaxial layer; (d) forming an oxide layer over a surface of the recess and a second portion of the epitaxial layer by relatively low-temperature oxidation; (e) defining and forming a drain and a source on a third portion of the epitaxial layer; and (f) forming a gate on a portion of the oxide layer in the recess and between the drain and source.

The present invention may best be understood through the following description with reference to the accompanying drawings, in which:

DETAILED DESCRIPTION OF THE PREFERRED EMBODIMENT

The present invention will now be described more detailedly with reference to the following embodiments. It is to be noted that the following descriptions of the preferred embodiments of this invention are presented herein for the purpose of illustration and description only. It is not intended to be exhaustive or to be limited to the precise form disclosed.

Figure 1:
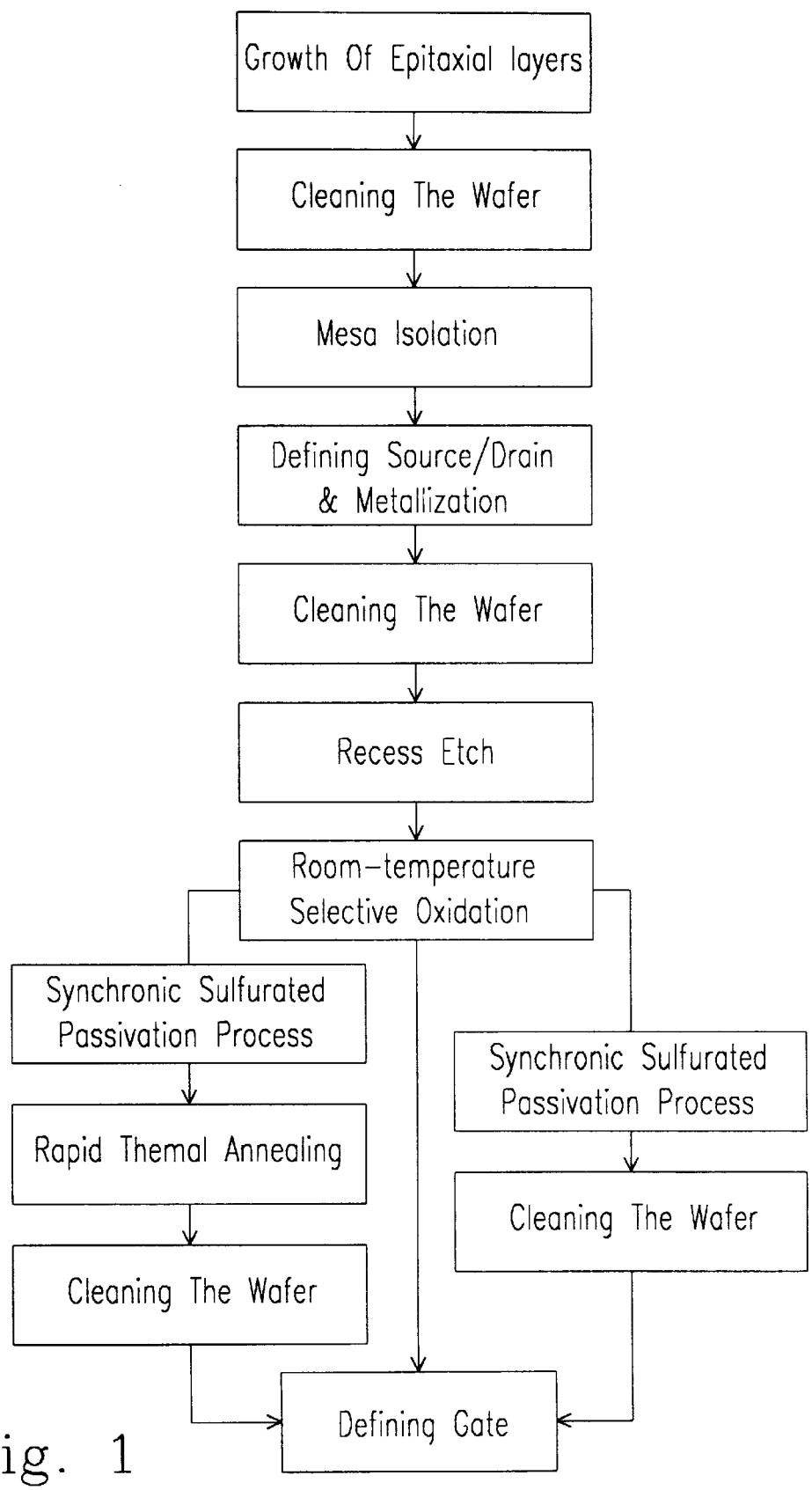
FIG. 1 is a flowchart showing the processes for fabricating a metal oxide semiconductor field effect transistor (MOSFET) according to the present invention.

The present invention provides a method for fabricating a metal oxide semiconductor field effect transistor (MOSFET). Please refer to FIG. 1 which is a flowchart illustrating the embodiments of the method of the present invention. According to the different selection of the process, there are four preferred embodiments described in detail as follows.

The First Preferred Embodiment

This process can be divided into several steps below:

A. Growth of Epitaxial Layer

Figure 2A:
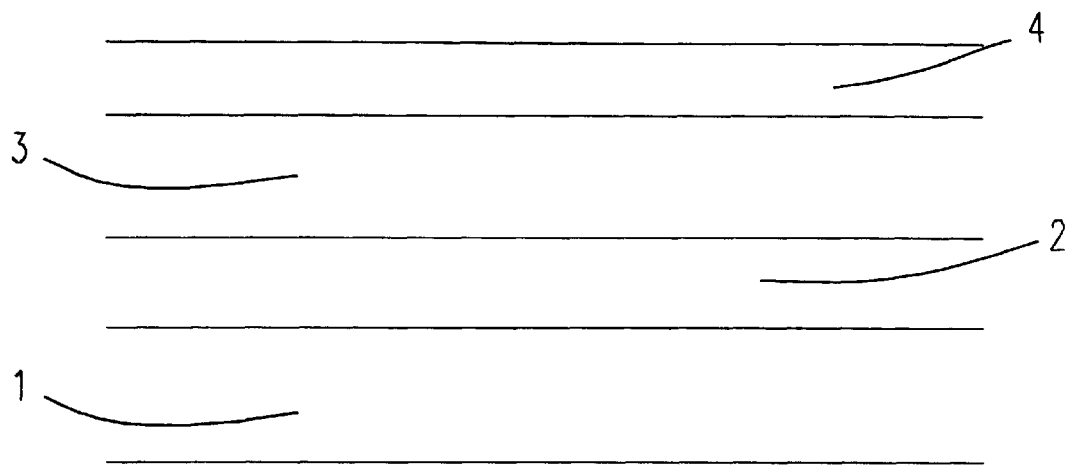
FIGS. 2a~2f are schematic diagrams showing a preferred embodiment of the method for fabricating a metal oxide semiconductor field effect transistor (MOSFET) according to the present invention.

The epitaxial layer includes an undoped buffer layer 2, a moderately doped layer 3, and a heavily doped layer 4. The undoped buffer layer 2 with a thickness of ~5000 Å, the moderately doped ($10^{16}$–$10^{17}$ cm$^{-3}$) layer 3 having a thickness of 2000~3000 Å (acting as a channel), and the 1000 Å thick heavily doped (>$10^{18}$ cm$^{-3}$) layer 4 (serving as drain/source ohmic contact) are formed on a semi-insulating GaAs substrate 1 in sequence by molecular beam epitaxy or organometallic vapor-phase epitaxy along the (100) direction, as shown in FIG. 2a.

B. Cleaning the Wafer

The fabricated wafer of Step A is immersed in 2-propanol, acetone, and methanol in sequence and cleaned by an ultrasonic oscillator.

C. Mesa Isolation

Figure 2B:
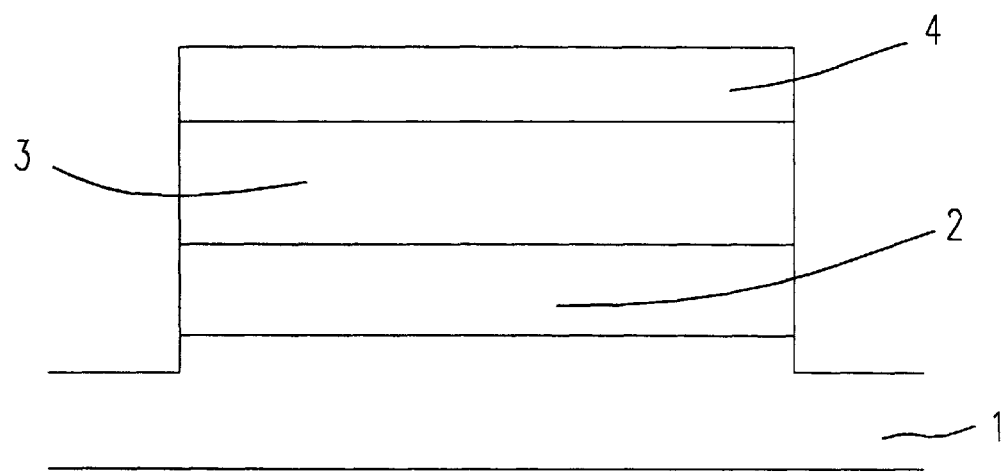

A photoresist is coated on the cleaned wafer and patterned by lithography. Then, the epitaxial layer not covered by the photoresist is etched by an etching solution (HF:$H_2O_2$:$H_2O$=1:2:25) to give a mesa isolation as shown in FIG. 2b. The used etching solution has a naturally rounded etching ability so that this is advantageous for the distribution of metal lines after mesa insolation. The mesa deepens to a place lower than the buffer layer 2 to ensure the isolation between the formed devices. The height of mesa can range from 6000 Å to 8000 Å

D. Formation and Metallization of Drain and Source

Figure 2C:
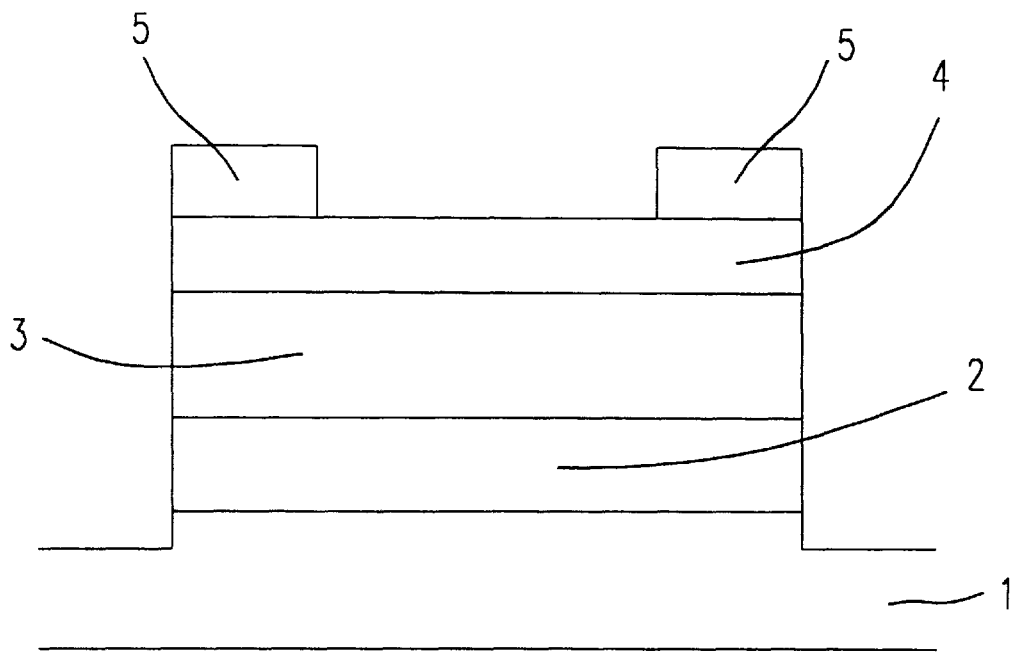

A photoresist is coated on the fabricated wafer of Step C and is patterned by lithography to define and form the drain and source. Thereafter, an alloy film is deposited thereon by e-beam evaporation (using Au/Ge/Ni for n+-type heavily doped layer; or using Au/Be for p+-type heavily doped layer) and then a lift-off process is performed to leave a drain/source metal in place. Finally, the wafer is put in the tube and annealed at 450~600° C. for 10~25 seconds to accomplish the metallization of the drain and source 5 as shown in FIG. 2c.

E. Cleaning the Wafer

The fabricated wafer of Step D is immersed in 2-propanol, acetone, and methanol in sequence and cleaned by an ultrasonic oscillator to remove the impurities deposited on the wafer during the annealing process.

F. Recess Etch

Figure 2D:
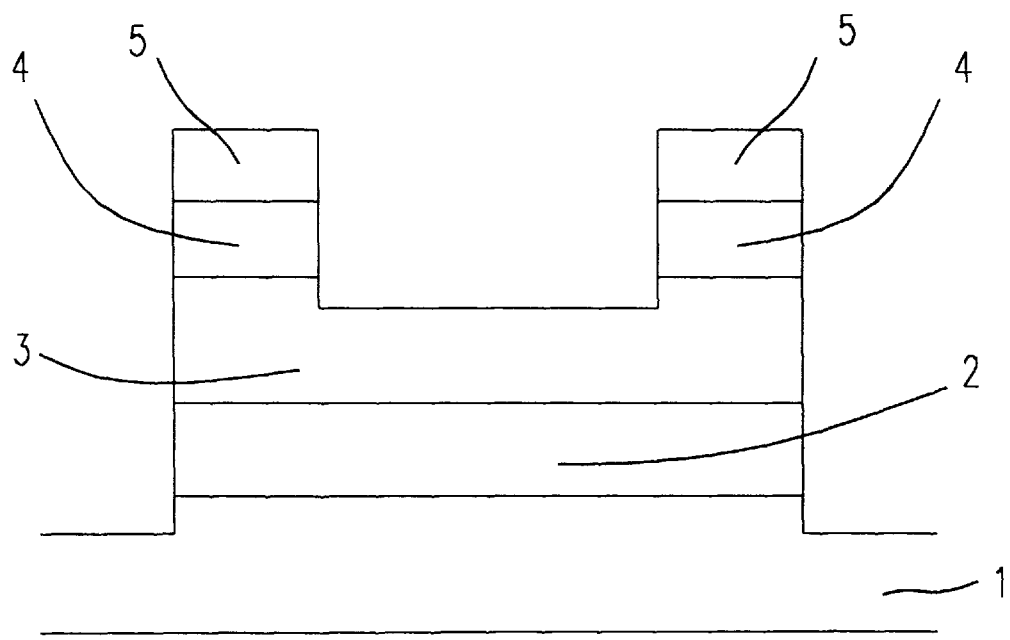

The wafer after treated by Step E is etched by an etching solution (NH$_3$:H$_2$O$_2$:H$_2$O=3:1:50) to form a recess in the channel 3 by self alignment, wherein at least the heavily doped layer 4 must be completely removed, as shown in FIG. 2d. Because Au/Ge/Ni or Au/Be alloy film can not be etched by the etching solution, the drain/source alloy film fabricated in Step D can be used as an etch mask.

G. Room-Temperature Selective Oxidation

Figure 2E:
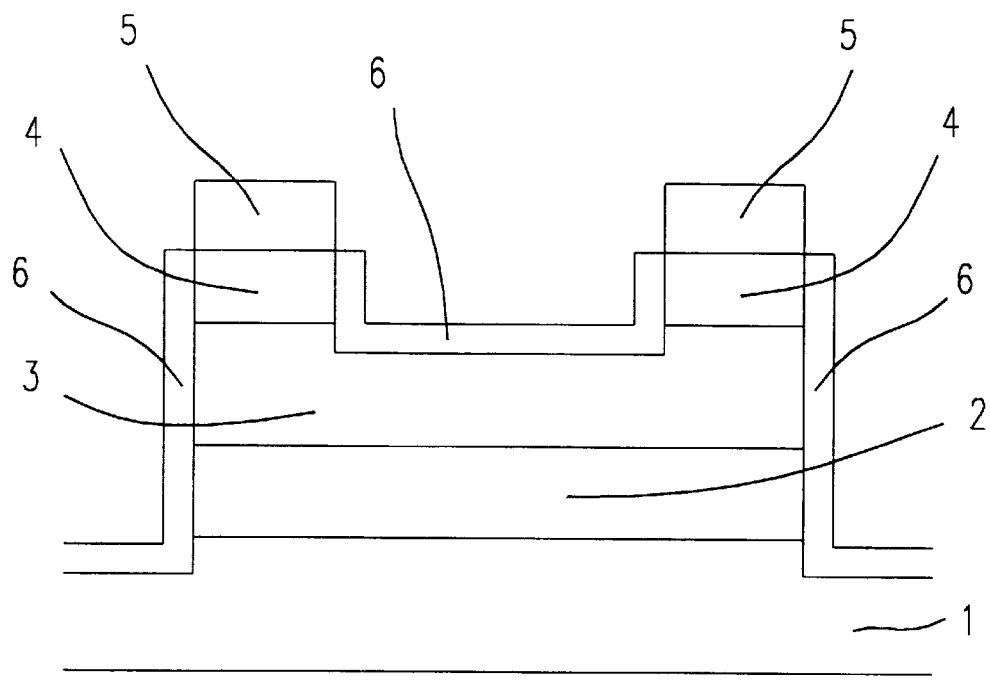
Figure 3:
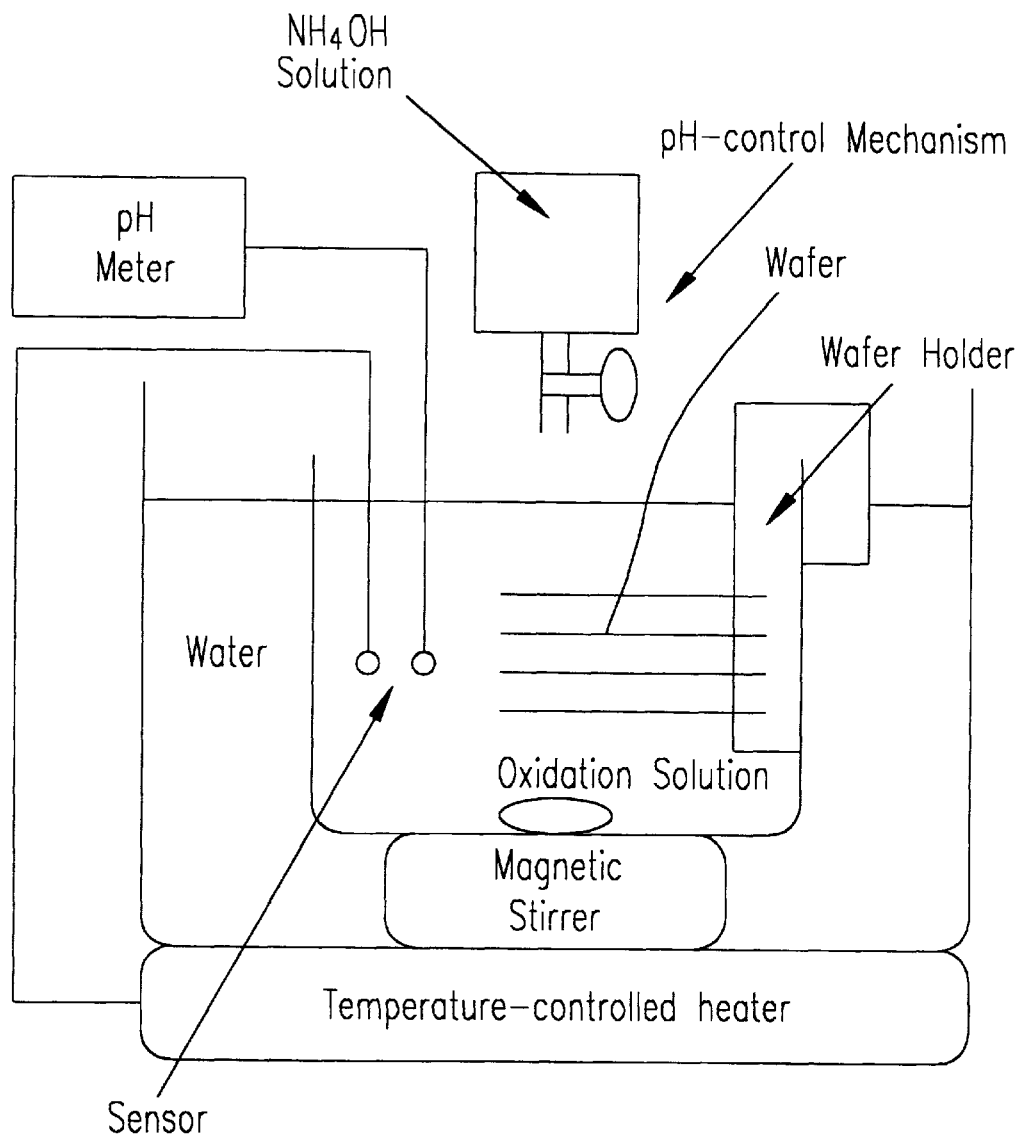
FIG. 3 is a schematic diagram showing a system for growing an oxide layer on a wafer according to the present invention.

Because the oxide layer 6 will be selectively grown on the portion of the epitaxial layer not covered by the alloy film by low-temperature liquid phase oxidation, there is no need to use the lithographic process. The fabricated wafer is shown in FIG. 2e. Preferably, the oxide layer is formed at 40~70° C. The growth thickness of the oxide layer 6 can be controlled according to the optimized parameters. The formed thickness of the oxide layer is controlled by using 1.15M nitric acid solution containing 0.36 mole of Ga ion whose initial pH value is adjusted to 4.3 by 2.5% ammonium hydroxide solution. Furthermore, during the formation of the oxide layer, an ammonium hydroxide (NH$_4$OH) solution, prepared from diluting commercially available 28% ammonium hydroxide solution with deionized water to 300 folds, is added therein for adjusting the pH value within a range between 4.0 and 5.0. The growth system of oxide layer is shown in FIG. 3. Although the prior system proposed in Japanese Journal of Applied Physics has a pH measurement, the pH value is used as an initial monitoring value. According to the present invention, a pH-control mechanism is used to control the growth rate and refractive index of the oxide layer. The magnetic stirrer can control the pH value and increase the uniformity of the oxide layer. The thermostatic tank is used for obtaining an even temperature distribution.

H. Defining and Forming a Gate

Figure 2F:
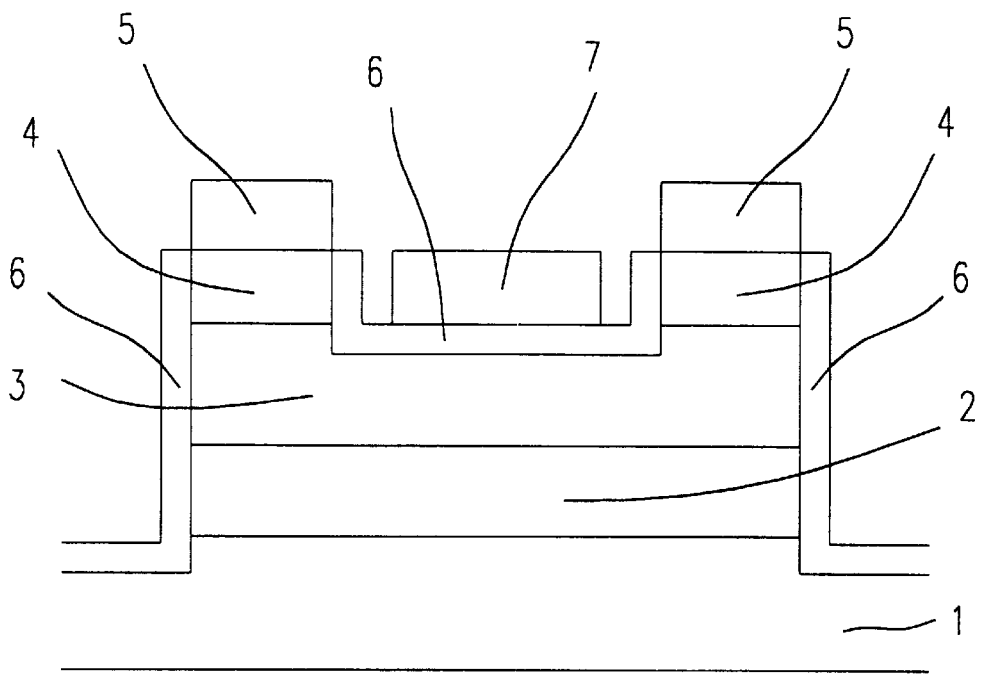

A photoresist is coated on the fabricated wafer of Step G and patterned to define a region on a portion of the oxide layer for forming a gate. Then, a conductive layer with a relatively high conductivity, such as gold, aluminum, or polysilicon, is coated thereon by a plating process and a lift-off process is performed to accomplish the formation of the gate 7. Finally, a novel MOSFET fabricated by low-temperature liquid phase oxidation for III–V group is shown in FIG. 2f.

The Second Preferred Embodiment

The difference between this embodiment and the first preferred embodiment is that the former further includes the step of synchronic sulfurated passivation. This step is a selective procedure. So-called "synchronic" means that this step and the above room-temperature selective oxidation are performed at the same time. First of all, $S_8$ powder is added to $(NH_4)_2S$ solution and the mixture is completely stirred at 60~70° C. The undissolvable $S_8$ powder is filtered out. Thereafter, an appropriate amount of the processed $(NH_4)_2S$ solution is added to the oxidation solution for growing the oxide layer at any time during the formation of the oxide layer.

The Third Preferred Embodiment

After the synchronic sulfurated passivation process, this embodiment further includes a Rapid thermal annealing (RTA) process. This process is also a selective procedure. The fabricated wafer is put into the RTA tube and is irradiated by a suitable light source. Finally, the wafer is quickly heat-treated for several to several ten seconds. Then, the fabricated wafer is immersed in 2-propanol, acetone, and methanol in sequence and cleaned by an ultrasonic oscillator to remove the impuritied deposited on the wafer during the RTA treatment.

The Fourth Preferred Embodiment

Figure 4A:
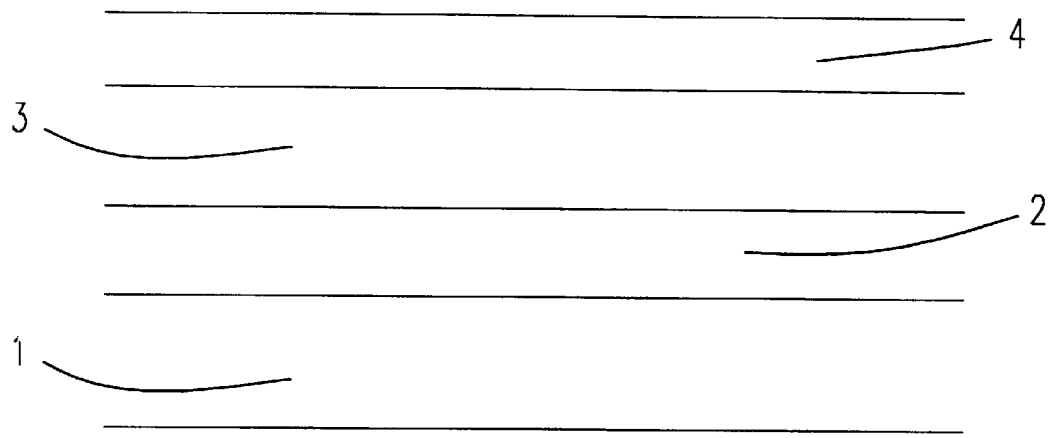
FIGS. 4a~4g are schematic diagrams showing another embodiment of the method for fabricating a metal oxide semiconductor field effect transistor (MOSFET) according to the present invention.
Figure 4B:
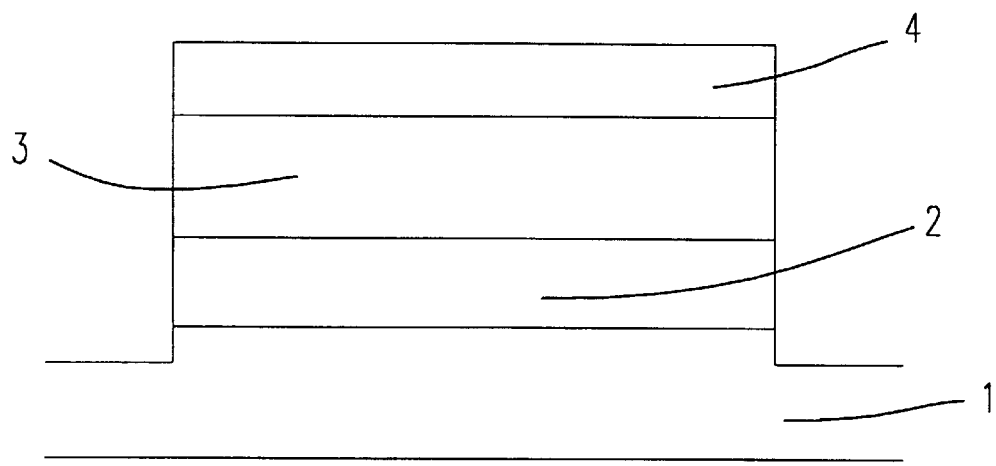
Figure 4C:
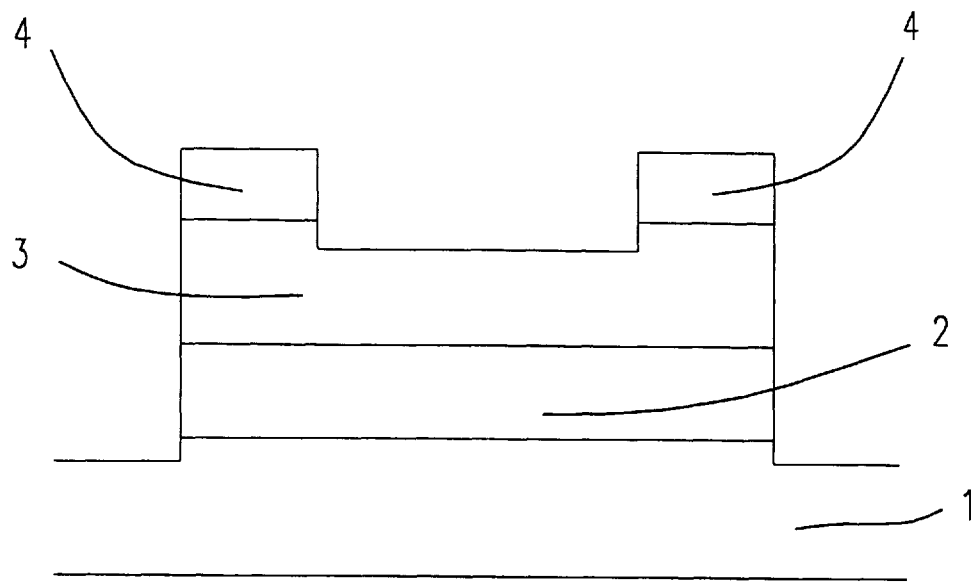
Figure 4D:
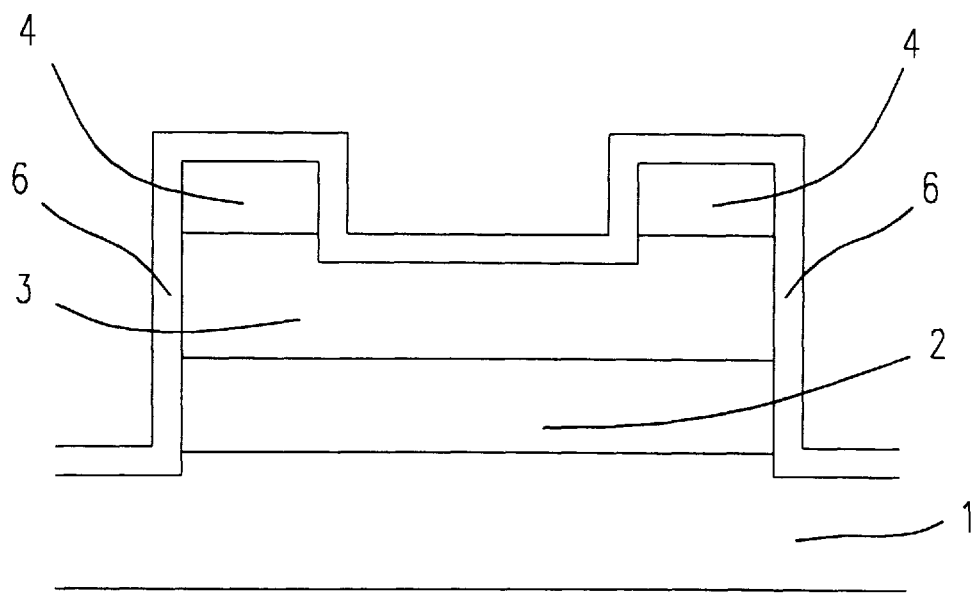
Figure 4E:
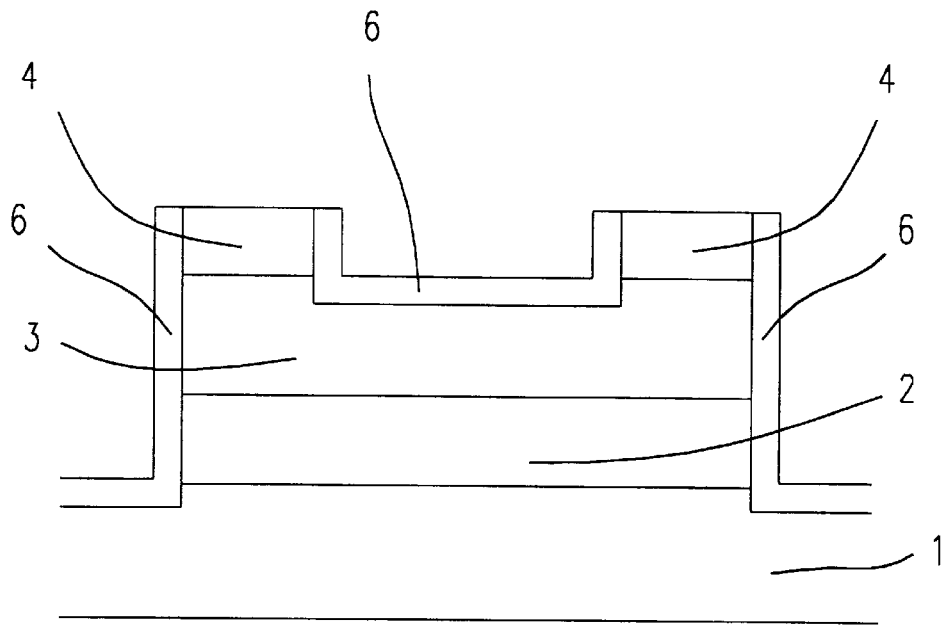
Figure 4F:
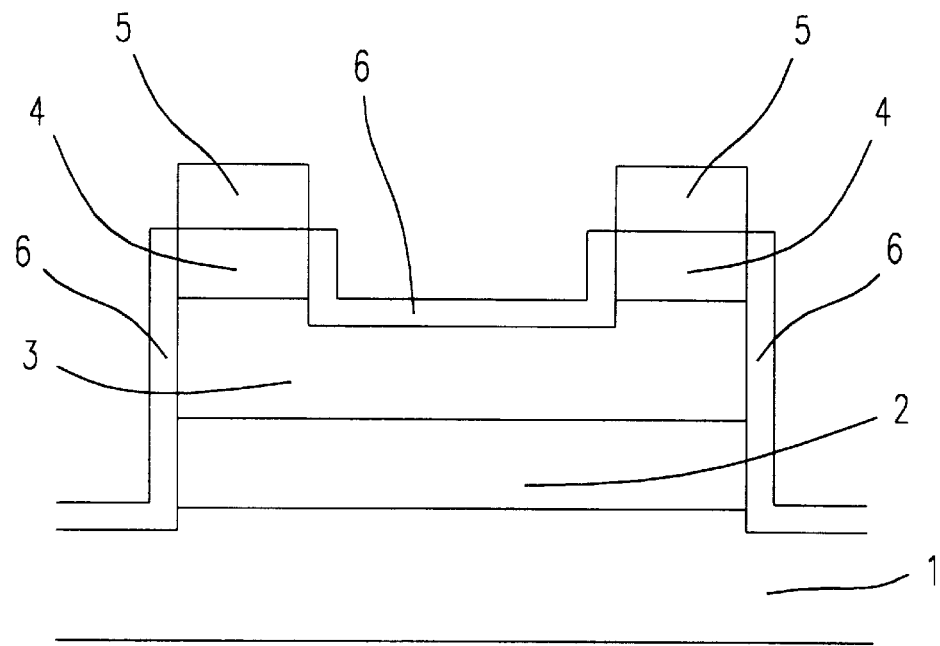
Figure 4G:
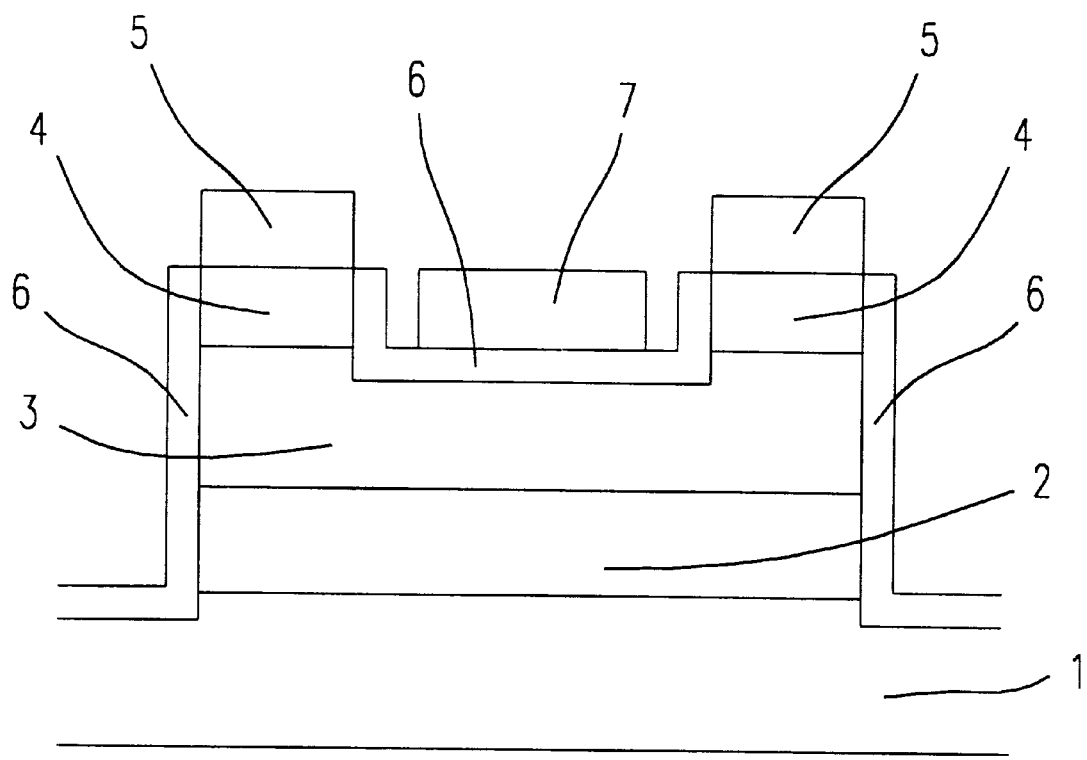

The procedure of this embodiment is slightly different from those of the above-described embodiments. The differences are described as follows and its overall process is illustrated in FIGS. 4a~4g. All symbols of the formed devices are identical to those shown in FIGS. 2a~2f. After the growth of epitaxial layer and the mesa isolation, the fabricated wafer is shown in FIG. 4b. Then, the fabricated wafer is coated by a positive photoresist (or coating a negative photoresist and using the same photoresist for defining drain and source) and a lithographic process and a dry or wet etching are performed to form a recess in the epitaxial layer as shown in FIG. 4c. Subsequently, a room-temperature selective oxidation is performed to form an oxide layer over the surfaces of the recess and the epitaxial layer as shown in FIG. 4d. A positive photoresist is coated on the fabricated wafer and then a lithographic process is performed for defining the drain and source regions. Thereafter, a dry or wet etching is performed to partially remove the oxide layer and expose a portion of the epitaxial layer to obtain a structure shown in FIG. 4e. At this time, there is no need to remove the photoresist. Subsequently, the metal plating process for the formation and metallization of the drain and source and other steps which are identical to those in the first embodiment are performed to accomplish the device shown in FIGS. 4f and 4g.

Figure 5:
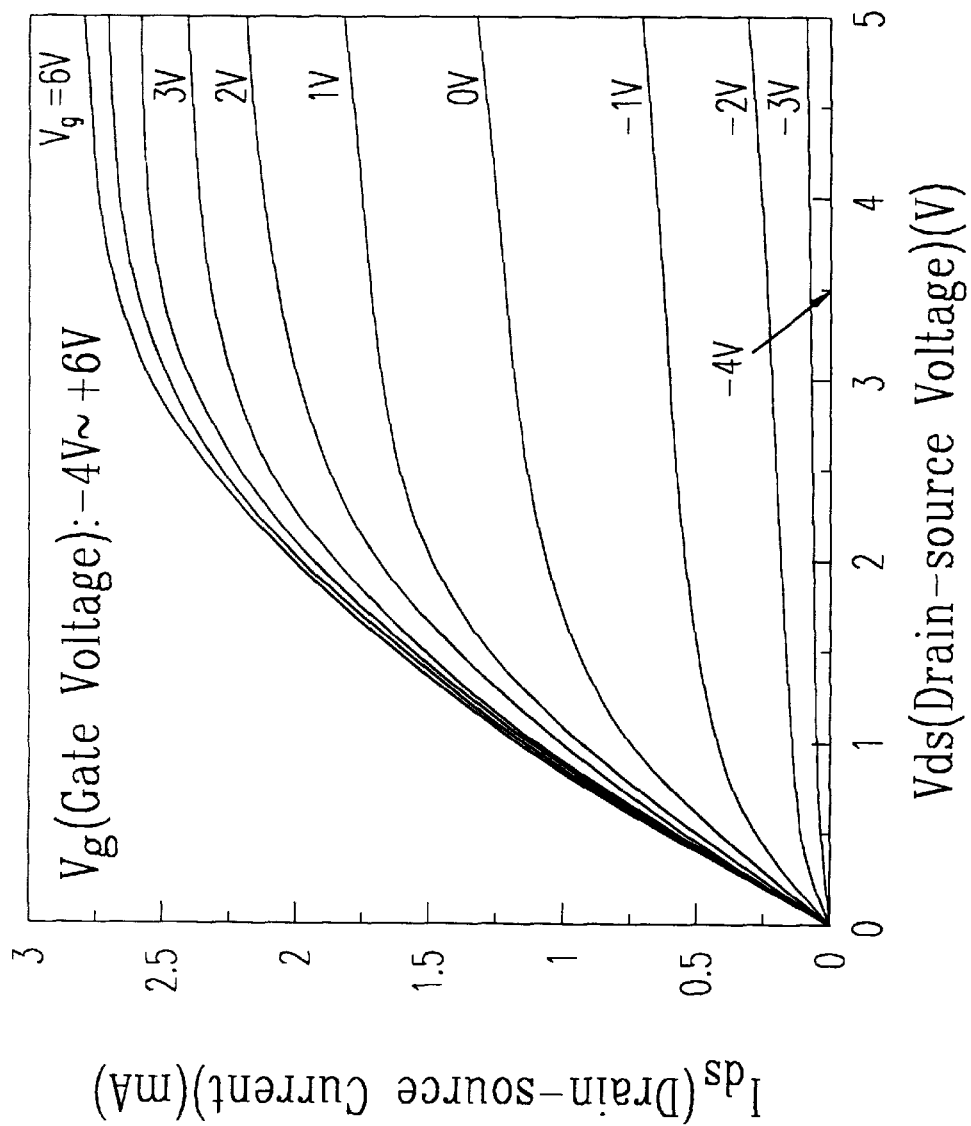
FIG. 5 is a graph showing the current-voltage characteristic of the drain and source of the MOSFET fabricated by the method of the present invention.

Comparing the conventional MOSFET with the depletion-mode MOSFET fabricated by the method of the present invention, the experimental results show that the transconductance of MOSFET is about 60 mS/mm under the same condition (the impurity concentration of the channel is $5 \times 10^{16}$ cm$^{-3}$ and W/L=40/2). To date, the characteristics of MOSFET have been improved and the Ids–Vds characteristic of MOSFET is shown in FIG. 5. The device property of MOSFET is superior to that of MOSFET. For the MOSFET fabricated by the method of the present invention, there are a lot of space in the development and application. Relative studies of the MOSFET can be found in our previous report (IEEE Electron Device Letters V. 20, n1, P. 18).

In conclusion, the overall manufacturing processes of FET proposed by the present invention only need three-time photolithographic process so as to simplify the manufacturing process. Moreover, all steps after Step D (that is, the formation of drain and source and metallization) can be operated near room temperature (40~70° C.) so that the influence of heat treatment on the quality of the GaAs epitaxial layer can be eliminated, especially in the channel under the recess. Finally, combined with the insulating oxide layer, the fabrication of gate on the channel does not need the Schottky contact. Therefore, there is a lot of elastic selections in the types of fabricated devices. For example, there are several selections for the layers 3 and 4 described as follows:

(1) N-type layer 3 incorporated with n+-type layer 4 is suitable for fabricating a depletion-mode n-MOSFET;

(2) P-type layer 3 incorporated with n+-type layer 4 is suitable for fabricating an enhancement-mode n-MOSFET;

(3) P-type layer 3 incorporated with p+-type layer 4 is suitable for fabricating a depletion-mode p-MOSFET; and (4) N-type layer 3 incorporated with p+-type layer 4 is suitable for fabricating an enhancement-mode n-MOSFET.

To sum up the above discussion, the present invention discloses a method for manufacturing a metal oxide semiconductor FET, which utilizes a low-temperature liquid phase oxidation for Ill–V group. This method can be operated near room temperature (40~70° C.) and will not cause a damage in the photoresist layer so that the noble metal or photoresist can be used as a stable mask for the selective growth of the oxide layer. At the same time, because the synchronic sulfurated passivation process and the growth of the oxide layer can be simultaneously performed together, the interface level density can be controlled for enhancing the device's property. Furthermore, the rapid thermal annealing (RTA) applied in this method can increase the reliability of the fabricated device.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for fabricating a gate of a gallium arsenide (GaAs) metal oxide semiconductor field effect transistor (MOSFET) on a wafer, comprising steps of:
   a) providing a GaAs substrate;
   b) forming an epitaxial layer on said GaAs substrate;
   c) defining and forming a drain and a source on a portion of said epitaxial layer;
   d) forming a recess in another portion of said epitaxial layer;
   e) forming an oxide layer on a surface of said recess by an oxidation at a near room temperature; and
   f) forming said gate on a portion of said oxide layer between said drain and source.

2. The method according to claim 1 wherein said GaAs substrate is a semi-insulating GaAs substrate.

3. The method according to claim 1 wherein said epitaxial layer is formed by one of molecular beam epitaxy and organometallic vapor-phase epitaxy.

4. The method according to claim 1 wherein said epitaxial layer includes a buffer layer, a moderately doped layer, and a heavily doped layer.

5. The method according to claim 4 wherein said buffer layer is an undoped layer and has a thickness of about 5000 Å.

6. The method according to claim 4 wherein said moderately doped layer has a thickness ranging from 2000 Å to 3000 Å, a concentration of $10^{16} \sim 10^{17}$ cm$^{-3}$, and serves as a channel.

7. The method according to claim 4 wherein said heavily doped layer has a thickness of 1000 Å, a concentration greater than $10^{18}$ cm$^{-3}$, and serves as an ohmic contact for said source and drain.

8. The method according to claim 4 wherein after said step (b), said method further includes a step (b1) of immersing said wafer in 2-propanol, acetone, and methanol in sequence and cleaning said wafer by an ultrasonic oscillator.

9. The method according to claim 8 wherein after said step (b1), said method further includes a step (b2) of executing a lithographic process to etch said epitaxial layer for giving a mesa isolation, in which said mesa deepens to a place lower than said buffer layer to isolate all formed devices on said wafer, and a height of said mesa ranges from 6000 Å to 8000 Å.

10. The method according to claim 9 wherein said mesa isolation is achieved by using an etching solution containing HF, $H_2O_2$, and $H_2O$ in a ratio of 1:2:25 by volume for giving rounded edges to said mesa.

11. The method according to claim 1 wherein said step (c) further includes steps of:
   c1) coating a photoresist on said epitaxial layer;
   c2) performing a lithographic process to pattern said photoresist for defining and forming said drain and source on said portion of said epitaxial layer;
   c3) coating an alloy film on said drain and source;
   c4) using a lift-off procedure to leave a drain/source metal in place; and
   c5) executing an annealing process to accomplish a metallization process of said drain and source.

12. The method according to claim 11 wherein in said step (c3), said alloy film is deposited by e-beam evaporation using one of Au/Ge/Ni and Au/Be.

13. The method according to claim 11 wherein in said step (c5), said annealing process is performed at 450~600° C. for 10~25 seconds.

14. The method according to claim 11 wherein in said step (d), said epitaxial layer is partially etched by using an etching solution containing $NH_3$, $H_2O_2$, and $H_2O$ in a ratio of 3:1:50 by volume and using said drain/source metal as a mask to form said recess in said another portion of said epitaxial layer.

15. The method according to claim 1 wherein in said step (e), said near room temperature is ranged from 40 to 70°.

16. The method according to claim 1 wherein in said step (e), a formed thickness of said oxide layer is controlled by using 1.15M nitric acid solution containing 0.36 mole of Ga ion whose initial pH value is adjusted to 4.3 by 2.5% ammonium hydroxide solution.

17. The method according to claim 16 further comprising an ammonium hydroxide solution prepared from diluting 28% ammonium hydroxide solution with de-ionized water to 300 folds for adjusting the pH value during the formation of said oxide layer to control the growth rate and refractive index of said formed oxide layer.

18. The method according to claim 1 wherein in said step (e), said method further includes a step (e1) of performing a synchronic sulfurated passivation process by adding a processed $(NH_4)_2S$ solution, prepared from adding a sulfur powder to $(NH_4)_2S$ solution, stirring, and filtering out the undissolved sulfur powder, to a system solution for forming said oxide layer at any time during the formation of said oxide layer.

19. The method according to claim 18 wherein after said step (e1), said method further includes a step (e2) of performing a rapid thermal annealing (RTA) process, wherein said wafer is heat-treated and irradiated for several to several ten seconds.

20. The method according to claim 19 wherein after performing said rapid thermal annealing process, said method further includes a step of immersing said wafer in 2-propanol, acetone, and methanol in sequence and cleaning said fabricated wafer by an ultrasonic oscillator to remove an impurity deposited on said fabricated wafer during said rapid thermal annealing process.

21. The method according to claim 1 wherein in said step (f), said gate is formed by steps of:
   f1) coating a photoresist on said wafer;
   f2) performing a lithographic process to pattern said photoresist for defining a gate region on said portion of said oxide layer;
   f3) coating a conducting layer with a relatively high conductivity on said defined region for said gate; and
   f4) using a lift-off procedure to form said gate on said portion of said oxide layer.

22. The method according to claim 21 wherein said conducting layer is a layer made of one selected from a group consisting of gold, aluminum, and polysilicon.

23. A method for fabricating a gate of a gallium arsenide (GaAs) metal oxide semiconductor field effect transistor (MOSFET) on a wafer, comprising steps of:
   a) providing a GaAs substrate;
   b) forming an epitaxial layer on said GaAs substrate;
   c) forming a recess in a first portion of said epitaxial layer;
   d) forming an oxide layer over a surface of said recess and a second portion of said epitaxial layer by an oxidation at a near room temperature;
   e) defining and forming a drain and a source on a third portion of said epitaxial layer; and
   f) forming said gate on a portion of said oxide layer in said recess and between said drain and source.

24. The method according to claim 23 wherein said step (c) further includes steps of:
  c1) forming a photoresist on said wafer and performing a lithographic process to define a region for said recess on said first portion of said epitaxial layer; and
  c2) partially etching said epitaxial layer to form said recess in said first portion of said epitaxial layer.

25. The method according to claim 24 wherein in said step (c2), said epitaxial layer is partially etched by one of dry etching and wet etching.

26. The method according to claim 24 wherein in said step (c2), said epitaxial layer is partially etched by using an etching solution containing $NH_3$, $H_2O_2$, and $H_2O$ in a ratio of 3:1:50 by volume.

27. The method according to claim 23 wherein said step (e) further includes steps of:
  e1) coating a photoresist on said wafer;
  e2) performing a lithographic process to pattern said photoresist for defining and forming said drain and source on said third portion of said epitaxial layer;
  e3) coating an alloy film on said drain and source;
  e4) using a lift-off procedure to leave a drain/source metal in place; and
  e5) executing an annealing process to accomplish a metallization process of said drain and source.

28. The method according to claim 27 wherein in said step (e3), said alloy film is deposited by e-beam evaporation using one of Au/Ge/Ni and Au/Be.

29. The method according to claim 27 wherein in said step (e5), said annealing process is performed at 450~600° C. for 10~25 seconds.

30. The method according to claim 23 wherein in said step (f), said gate is formed by steps of:
  f1) coating a photoresist on said wafer;
  F2) performing a lithographic process to pattern said photoresist for defining a gate region on said portion of said oxide layer;
  f3) coating a conducting layer with a relatively high conductivity on said defined region for said gate; and
  f4) using a lift-off procedure to form said gate on said portion of said oxide layer.

31. The method according to claim 30 wherein said conducting layer is a layer made of one selected from a group consisting of gold, aluminum, and polysilicon.

* * * * *